United States Patent
Yoshikawa et al.

(10) Patent No.: US 7,359,416 B2
(45) Date of Patent: Apr. 15, 2008

(54) OPTICAL SEMICONDUCTOR DEVICE

(75) Inventors: Noriyuki Yoshikawa, Osaka (JP); Masanori Minamio, Osaka (JP); Hisanori Ishiguro, Shiga (JP); Hideyuki Nakanishi, Shiga (JP); Hiroyuki Ishida, Osaka (JP); Yoshihiro Tomita, Osaka (JP); Toshiyuki Fukuda, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/708,478

(22) Filed: Feb. 21, 2007

(65) Prior Publication Data

US 2007/0217476 A1    Sep. 20, 2007

(30) Foreign Application Priority Data

Mar. 15, 2006  (JP) ............................. 2006-070819
Mar. 30, 2006  (JP) ............................. 2006-095031

(51) Int. Cl.
*H01S 3/14*  (2006.01)
*H01S 3/07*  (2006.01)

(52) U.S. Cl. ............................................ 372/39; 372/66
(58) Field of Classification Search ................. 372/39, 372/43.01, 66, 67
See application file for complete search history.

(56) References Cited

U.S. PATENT DOCUMENTS

2002/0121863 A1 * 9/2002 Morishita ................ 315/169.3

FOREIGN PATENT DOCUMENTS

| JP | 11-87849 | 3/1999 |
| JP | 2002-314184 | 10/2002 |
| JP | 2003-23200 | 1/2003 |

* cited by examiner

*Primary Examiner*—Armando Rodriguez
(74) *Attorney, Agent, or Firm*—McDermott Will & Emery LLP

(57) ABSTRACT

An optical semiconductor device includes a semiconductor laser chip, a base for mounting the semiconductor laser chip and a solder layer sandwiched between the top surface of the base and the bottom surface of the semiconductor laser chip. The semiconductor laser chip is warped in upward convex shape.

15 Claims, 9 Drawing Sheets

Sn COMPOSITION RATIO

OPTICAL SEMICONDUCTOR DEVICE

BACKGROUND OF THE INVENTION

1. Field of the Invention

The present invention relates to optical semiconductor devices. In particular, it relates to high efficiency optical semiconductor devices used for rewritable optical discs and high-speed, large-capacity optical communications.

2. Description of Related Art

As we are in a sophisticated information society, high-speed/large-capacity optical communication technologies have been demanded for communication tools typified by the Internet. At the same time, optical discs which are rewritable at higher speed with larger capacity have been demanded as a means for storing large volumes of information obtained through the communication. Under these circumstances, optical semiconductor devices such as semiconductor lasers are assumed as key devices in the optical communication and optical disc technologies. Therefore, improvement in performance, functionality and reliability of the optical semiconductor devices has been longed for.

A major technique for enhancing the performance of the optical semiconductor devices is to connect a semiconductor laser chip to a base. As an example, FIG. 10 shows the structure of a conventional optical semiconductor device.

FIG. 10 shows a major part of an optical semiconductor device 10 used as a light source for optical communications. The optical semiconductor device 10 includes a Si substrate 3 and a distributed feedback semiconductor laser chip 1. A $SiO_2$ film 5 is formed on the top surface of the Si substrate 3 and an electrode pattern 6 is formed on the $SiO_2$ film 5. Further, a solder layer 7 is formed on the electrode pattern 6 so that the semiconductor laser chip 1 is adhered to the electrode pattern 6 via the solder layer 7.

The semiconductor laser chip 1 has a mesa portion 8 formed in the middle of the bottom surface thereof. The solder layer 7 is applied to part of the bottom surface of the semiconductor laser chip 1 except the mesa portion 8. That is, a gap 9 is formed between the mesa portion 8 and the $SiO_2$ film 5. Further, an active layer 2 for emitting a laser beam is formed in part of the mesa portion 8 near the bottom surface of the semiconductor laser chip 1.

In this optical semiconductor device 10, the semiconductor laser chip 1 is mounted on the Si substrate 3 in the following manner. First, molten solder is applied onto the electrode pattern 6 and the semiconductor laser chip 1 is laid on the molten solder, followed by cooling to solidify the solder. In general, the semiconductor laser chip and the Si substrate have different thermal expansion coefficients. Therefore, during the solidification of the solder, the active layer 2 may be distorted or residual stress may be caused in the active layer 2.

However, since the gap is formed between the mesa portion 8 and the $SiO_2$ film 5 as described above, the active layer 2 does not contact the solder layer 7. Therefore, the possibility that the active layer 2 is distorted or the residual stress occurs in the active layer 2 is significantly reduced. As a result, the distributed feedback optical semiconductor device 10 becomes capable of operating in a single mode at a stable oscillation wavelength (e.g., see Japanese Unexamined Patent Publication No. 2002-314184).

Another optical semiconductor device according to Japanese Unexamined Patent Publication No. H11-87849 (not shown) has substantially the same structure as the optical semiconductor device 10 except that the mesa portion is not formed in the semiconductor laser chip. Also in this case, the semiconductor laser chip and the substrate for mounting the semiconductor laser chip thereon have different thermal expansion coefficients. Therefore, residual stress occurs in the active layer of the semiconductor laser chip after it is mounted on the substrate. The residual stress may possibly cause instability in characteristics of a diffraction grating of the active layer. However, as the gap reduces the possibility of the instability in the characteristics of the diffraction grating of the active layer, stable oscillation characteristics are obtained.

Further, Japanese Unexamined Patent Publication No. 2003-23200 discloses a structure intended to reduce the residual stress, improve laser characteristics when the semiconductor laser chip is operated at a high temperature and improve the reliability of the semiconductor device. Specifically, a groove is formed in part of the top surface of the substrate opposing the mesa portion and the solder layer is formed in the groove in a stripe form. As the solder layer does not contact part of the bottom surface of the semiconductor laser chip around the mesa portion, the residual stress is reduced. Further, in part of the bottom surface of the semiconductor laser chip outside the mesa portion, another solder layer having a higher melting point than that of the stripe-shaped solder layer is provided substantially parallel to the groove. With this structure, the semiconductor laser chip is electrically connected to the substrate, while the excellent ability of dissipating heat of the semiconductor laser device is ensured.

SUMMARY OF THE INVENTION

An optical semiconductor device of the present invention includes a light emitting element, a base for mounting the light emitting element on a top surface thereof and a connection layer sandwiched between the top surface of the base and a bottom surface of the light emitting element. The light emitting element is warped in upward convex shape.

DETAILED DESCRIPTION OF THE INVENTION

Figure 1A:
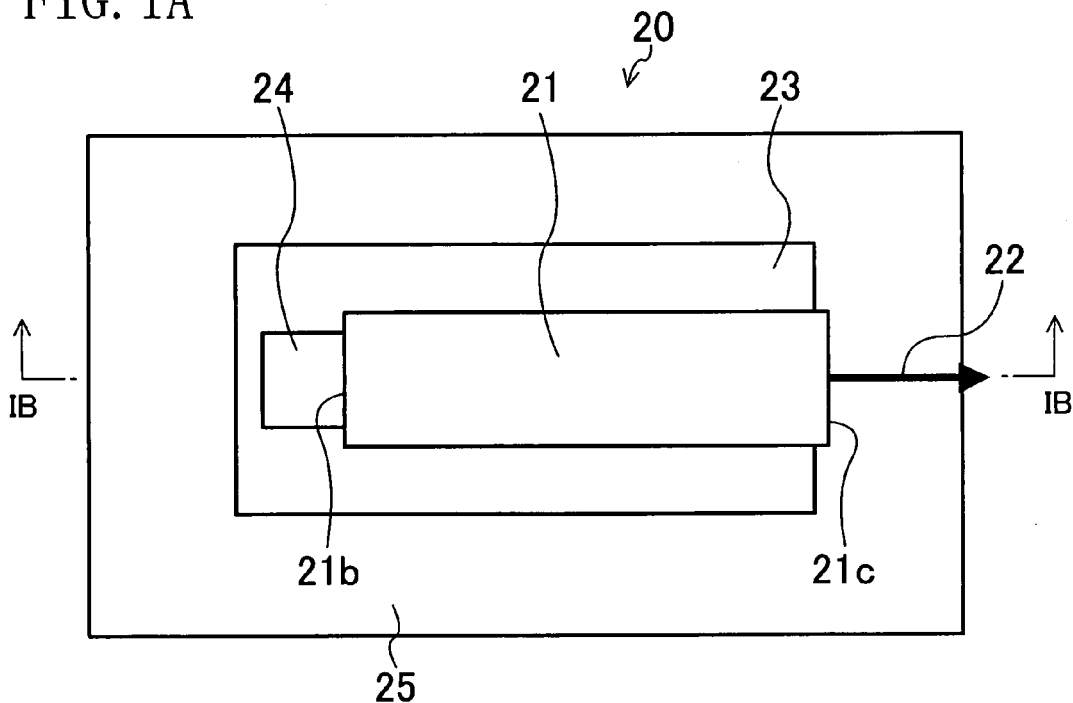
FIG. 1A is a top view illustrating the structure of an optical semiconductor device according to a first embodiment of the present invention.

As described above, if a gap is formed between the bottom surface of the semiconductor laser chip and the top surface of the substrate, residual stress is reduced in the direction parallel to the end faces of a resonator of the semiconductor laser chip. However, in order to further improve the performance and reliability of the optical semiconductor device, it is preferred to reduce the residual stress also in the direction of the resonator of the semiconductor laser chip.

Further, in order to meet the increasing demand for high-power optical semiconductor devices, the resonator of the semiconductor laser chip has to be made longer and therefore the semiconductor laser chip also becomes longer. When the length of the semiconductor laser chip is increased, control must be done such that the residual stress is applied in the direction of the resonator of the semiconductor chip. If not, lot-produced optical semiconductor devices, e.g., high-power semiconductor lasers for optical discs, show polarization ratios different from each other. Alternatively, their changes in operating current value at an early stage of burn-in may vary. As a result, the devices show considerable variations both in polarization ratio and change in operating current value. For information, the polarization ratio is a main characteristic of the semiconductor laser for optical discs.

The present invention has been achieved in view of the above-described drawbacks. According to the present invention, the residual stress is reduced also in the direction of the resonator of the light emitting element.

Hereinafter, explanation of the optical semiconductor devices according to the embodiments of the present invention is provided with reference to the drawings. Explanation of components identified with the same reference numeral is omitted in some cases.

FIRST EMBODIMENT

Figure 1B:
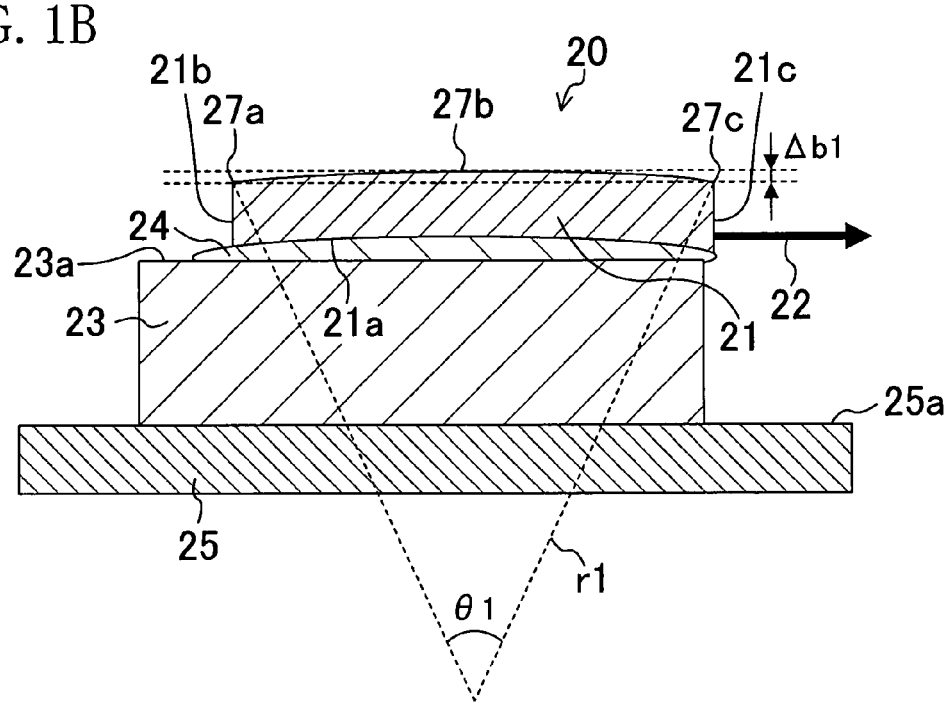
FIG. 1B is a sectional view taken along the line IB-IB shown in FIG. 1A.
Figure 2:
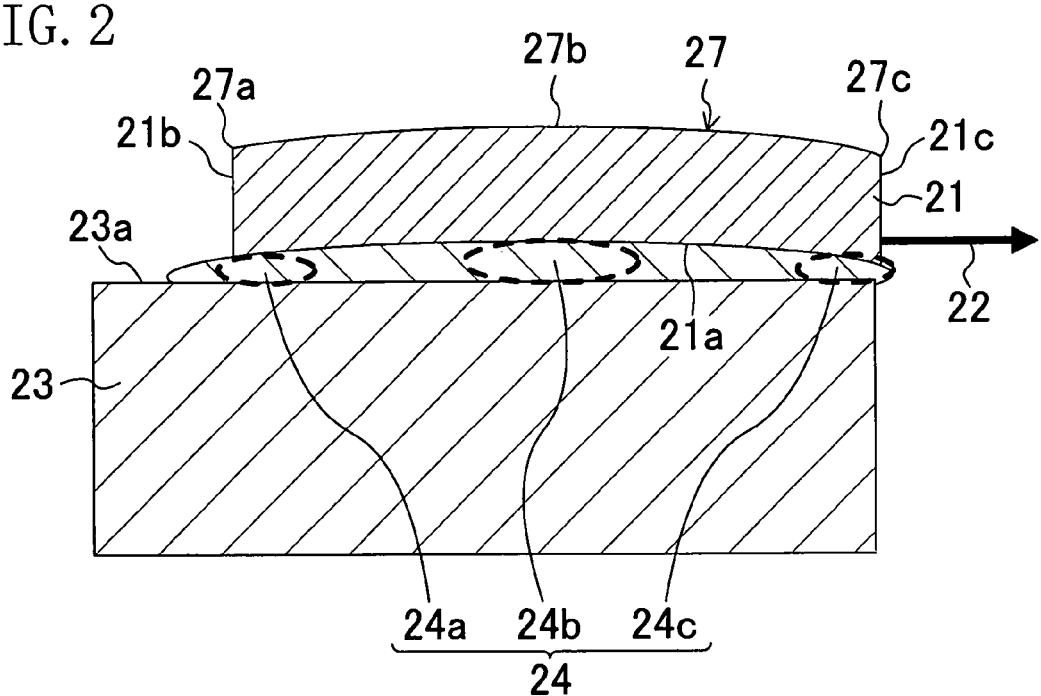
FIG. 2 is a view illustrating a semiconductor laser chip implemented in the optical semiconductor device of the first embodiment of the present invention.

FIG. 1A is a top view illustrating the structure of an optical semiconductor device 20 according to a first embodiment and FIG. 1B is a sectional view taken along the line IB-IB shown in FIG. 1A.

As shown in FIG. 1A, the optical semiconductor device 20 includes a semiconductor laser chip (light emitting element) 21, a submount (base) 23, a solder layer (connection layer) 24 and a metallic base 25. The semiconductor laser chip 21 is adhered to a top surface 23a of the submount 23 with the solder layer 24 and the submount 23 is adhered to a top surface of the metallic base 25 with another solder layer (not shown). The submount 23 may be made of Si or material highly capable of dissipating heat and having a thermal expansion coefficient lower than that of the semiconductor laser chip 21 (e.g., SiC or AlN). The metallic base 25 is part of a package which is not shown.

Hereinafter, detailed explanation of the semiconductor laser chip 21 and the solder layer 24 is provided. An active layer (not shown) in the semiconductor laser chip 21 emits a laser beam 22. The active layer is provided in part of the semiconductor laser chip 21 closer to a bottom surface 21a of the semiconductor laser chip 21 than to a top surface 27 thereof. The laser beam 22 is emitted along an arrow shown in FIG. 1B. Therefore, the direction of the arrow is assumed as the direction of a resonator of the semiconductor laser chip 21, i.e., the direction of the optical axis of the light emitted from the optical semiconductor device 20. End faces 21b and 21c of the semiconductor laser chip 21 extending substantially vertical to the optical axis direction function as reflective mirrors of the resonator.

The semiconductor laser chip 21 is warped in upward convex shape as shown in FIG. 1B. In other words, the semiconductor laser chip 21 is warped such that a middle portion 27b thereof in the optical axis direction protrudes upward by $\Delta$b1 from both end portions 27a and 27c in the optical axis direction. That is, the semiconductor laser chip 21 is warped to draw an upward arc having a radius of curvature r1 and a central angle $\theta$1.

Thus, when the optical semiconductor devices 20 are lot-produced with the semiconductor laser chips 21 warped in upward convex shape, their initial characteristics (e.g., polarization ratio, symmetry of angle of divergence of the laser beam and linearity of current-optical output characteristic) are made uniform and their changes in operating current value at an early stage of burn-in are made uniform. This makes it possible to achieve the optical semiconductor device 20 with high performance and high reliability.

The solder layer 24 fills a gap formed between the bottom surface 21a of the semiconductor laser chip 21 and the top surface 23a of the submount 23. The semiconductor laser chip 21 is warped in upward convex shape as described above, while the top surface 23a of the submount 23 is flat. Therefore, in the optical axis direction, the volume of the gap formed therebetween is smaller in the end portions than in the middle portion. As a result, the solder layer 24 is configured to have a middle portion 24b thicker than end portions 24a and 24c in the optical axis direction.

The solder layer 24 contains Sn and Au. The melting point of the solder layer 24 is preferably close to the temperature at which the semiconductor device 20 is operated (hereinafter referred to as "operating temperature"). In order to connect the semiconductor laser chip 21 to the submount 23 with the solder, the semiconductor laser chip 21 is adhered to the solder in a molten state and then the solder is cooled to solidify. If the melting point of the solder layer 24 is close to the operating temperature, stress that occurs during the solidification of the solder is reduced. In order to have the melting point of the solder layer 24 close to the operating temperature, the solder layer 24 is preferably Sn-rich. The reason is described with reference to the phase diagram shown in FIG. 3.

Figure 3:
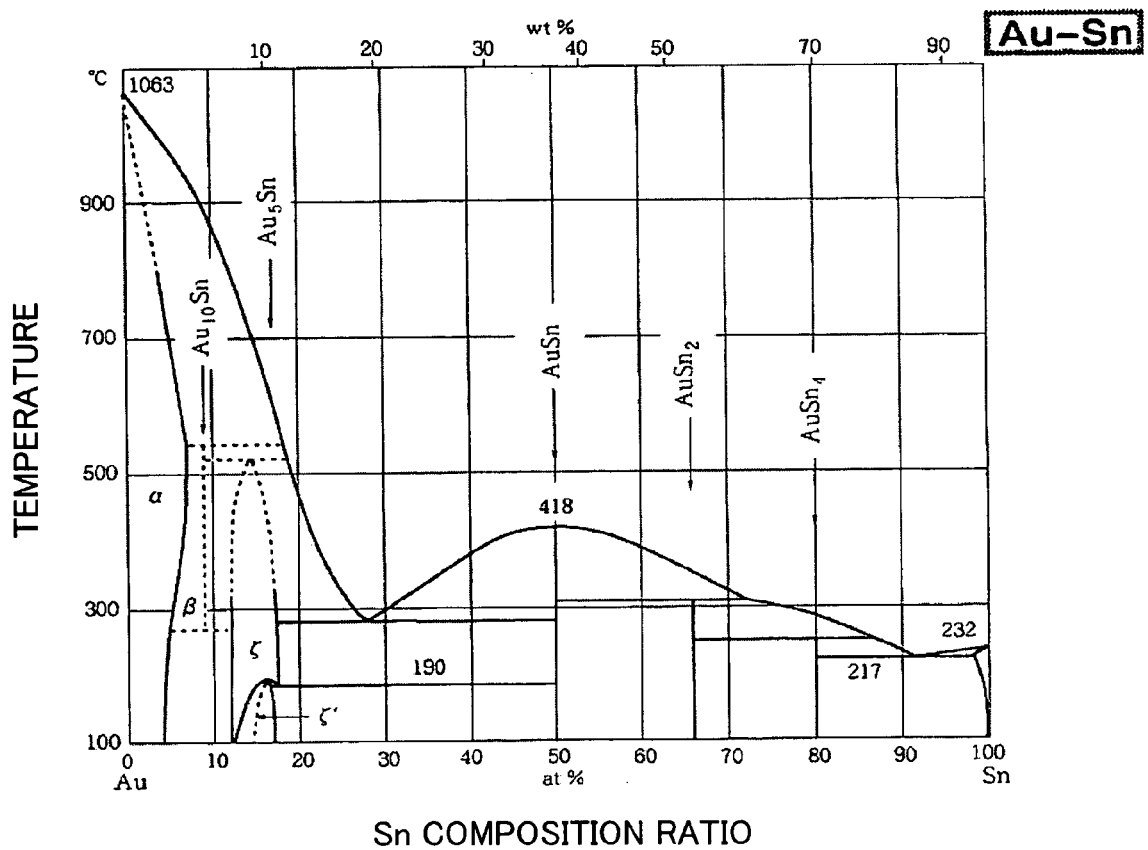
FIG. 3 is a phase diagram of Au/Sn solder.

FIG. 3 shows a phase diagram between Sn and Au. In FIG. 3, the longitudinal axis indicates the melting point of the solder and the lateral axis indicates the composition ratio of Sn to Au.

If solder containing more Au than Sn, i.e., solder containing less than 50% Sn is molten and solidified, the solder is solidified at 280° C. to become Au-rich eutectic solder.

On the other hand, if solder containing about 90% Sn is molten and solidified, the solder is solidified at 217° C. Therefore, in order to bring the melting point of the solder close to the operating temperature, the Sn-rich solder is preferably used.

The ratio of Sn to Au in the solder layer 24 is higher in the middle portion 24b thereof than in the end portions 24a and 24c in the optical axis direction. The reason why the Sn ratio in the solder layer varies will be explained later in the description of a method for manufacturing the semiconductor device 20.

The inventors of the present invention have fabricated laser devices which emit a red laser beam to examine the initial characteristics of the laser beam and the composition of the solder layer 24.

Figure 4:
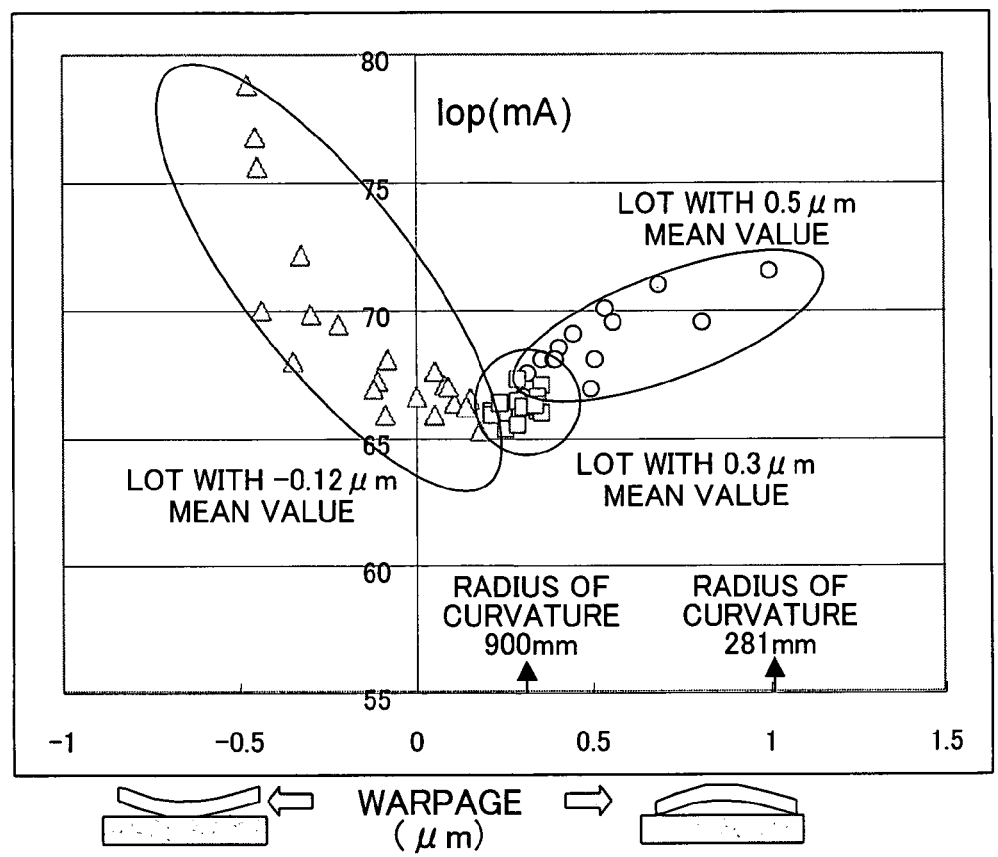
FIG. 4 is a graph illustrating the relationship between warpage of the optical semiconductor chip and operating current value.

First, explanation of the semiconductor laser chip 21 of the thus fabricated laser devices is provided. The semiconductor laser chip 21 was made of AlGaInP having a wavelength of 650 nm, a peak pulse optical output of 300 mW, a chip length of 1,500 µm, a chip width of 300 µm and a chip thickness of 110 µm. Three kinds of laser devices are lot-produced while the mean value of Δb1 shown in FIG. 1B was varied to be −0.12 µm, 0.3 µm and 0.5 µm and their initial operating current values were measured. The measurement results are shown in FIG. 4. The lateral axis of FIG. 4 indicates warpage Δb1 and the longitudinal axis indicates the operating current value.

As shown in FIG. 4, as to a production lot with the Δb1 mean value of −0.12 µm, i.e., a lot of devices including the semiconductor laser chips 21 warped in downward convex shape, the operating current values were significantly varied. In contrast, a production lot with the Δb1 mean value of 0.3 µm showed substantially uniform operating current values.

Further, as to a lot with the Δb1 mean value of 0.3 µm, the initial characteristics of the laser beams emitted from the semiconductor laser chips 21 were examined. The results show that the initial characteristic values of the optical semiconductor devices 20 were substantially the same, i.e., the initial characteristic values were less varied. An average value of the initial characteristic values of the optical semiconductor devices 20 was in the preferable range. This indicates that a laser device with high performance and high reliability is obtained if the semiconductor laser chip 21 is used. Thus, the warpage Δb1 is preferably 0.3 µm. When the warpage Δb1 was 0.3 µm, the radius of curvature r1 was 900 nm. Therefore, the radius of curvature r1 is preferably 900 nm or more.

As to the lot with the Δb1 mean value of 0.5 µm, the maximum Δb1 value was 1.0 µm with a radius of curvature r1 of 281 mm. Further, as to the lot with the Δb1 mean value of 0.3 µm, the radius of curvature was about 900 nm. This indicates that the semiconductor laser chip 21 is preferably warped in upward convex shape to draw an arc having a radius of curvature of not less than 280 mm, preferably not less than 900 mm.

The warpage Δb1 was calculated by measurement and analysis of interference fringes by a laser beam. As the measuring limit of the interference fringes by a laser beam is 0.05 µm, the upper limit of the radius of curvature was 6,000 mm when the semiconductor laser chip 21 is warped in upward convex shape. However, if the chip length of the semiconductor laser chip 21 increases, the upper limit of the radius of curvature also increases. Therefore, when the semiconductor laser chip 21 having a chip length of 3,000 µm is warped in upward convex shape, the upper limit of the radius of curvature will be 22,500 mm.

The semiconductor laser chip 21 was cut to measure the warpage Δb1 from the cross-section geometry. The results indicate that the devices with the Δb1 mean value of 0.02 µm showed uniform changes both in the initial characteristics of the laser beams and the operating current values at an early stage of the burn-in. When the semiconductor laser chip 21 has the warpage Δb1 of 0.02 µm and a chip length of 3,000 µm, the upper limit of the radius of curvature is 56,250 mm. Therefore, the semiconductor laser chip 21 is preferably warped in upward convex shape to draw an arc having a radius of curvature of not less than 280 nm and not more than 56,250 mm.

In summary, the semiconductor laser chip 21 is preferably warped in upward convex shape to draw an arc having a radius of curvature of not less than 280 mm and not more than 56,250 mm, more preferably not less than 280 mm and not more than 22,500 mm.

The inventors of the present invention have further examined the solder layer 24 after the above-described examinations. The thickness of the solder layer 24 was 4.8 µm at the middle portion 24b in the optical axis direction and 3.8 µm at the end portions 24a and 24c in the optical axis direction. The solder layer 24 contained Au and Sn. It is considered that Au in the solder layer 24 is derived from a molten portion of an Au plating layer formed on the semiconductor laser chip 21. Further, it is assumed that Sn is derived from a molten portion of a Sn-containing solder layer formed on the top surface 23a of the submount 23 to mount the semiconductor laser chip 21.

The inventors of the present invention have prepared semiconductor laser chips which are warped in downward convex shape and examined the initial characteristics of laser beams emitted by them. The optical semiconductor devices with the semiconductor chips were varied in initial characteristics. Their variations were too large to mass-produce the laser devices. Using the semiconductor laser chips warped in downward convex shape, layered optical semiconductor devices were fabricated and subjected to burn-in. As a result, the mean value of the initial operating current values and the variation from the initial operating current values were higher than those obtained with the semiconductor laser chips which are warped in upward convex shape.

Even if the semiconductor laser chips are warped in upward convex shape, when the radius of curvature r1 is less than 250 mm, huge stress is applied to the semiconductor laser chips and the mean value of the operating current value was increased as compared with the case where the radius of curvature is not less than 250 mm. If the mean value of the operating current value increases, the optical semiconductor devices generate large heat when they are installed in optical pickups. This is not preferable because the temperature of the optical semiconductor devices drastically increases. Therefore, it is preferable to make the semiconductor laser chip 21 warped in upward convex shape to have a radius of curvature r1 of not less than 250 mm.

As described above, when the semiconductor laser chip 21 is mounted on the base with the solder layer 24 interposed therebetween, residual stress is applied to the semiconductor laser chip 21 (especially to the active layer) in a certain direction within a certain range. However, if the semiconductor laser chip 21 is warped in upward convex shape as shown in FIG. 1B, the substantially identical initial characteristics of the lot-produced devices are made uniform and the changes in operating current value at an early stage of burn-in are made uniform. Although the mechanism is unknown, the inventors of the present invention assume that this phenomenon occurs for the following reason. If the semiconductor laser chip 21 is warped in upward convex shape, part of the bottom surface 21a of the semiconductor laser chip 21 near the active layer contracts, thereby reducing variations in gain in the optical axis direction.

Subsequently, explanation of a method for manufacturing the optical semiconductor device 20 of the present embodiment is provided. According to the method, the semiconductor laser chip 21 is soldered on the top surface 23a of the submount 23. Hereinafter, a method for soldering the semiconductor laser chip 21 is explained.

First, solder is provided on the top surface 23a of the submount 23.

Then, the submount 23 provided with the solder is heated from above and below to melt the solder. The semiconductor laser chip 21 is held by a heated vacuum tweezer and pressed onto the molten solder, thereby soldering the semiconductor laser chip 21 on the top surface 23a of the submount 23.

The heating from below is then ceased to solidify the solder.

During this time, the bottom surface 21a of the semiconductor laser chip 21 is cooled faster than the top surface 27 thereof. Accordingly, the semiconductor laser chip 21 is warped in upward convex shape. It is preferred that the submount 23 has a thermal expansion coefficient slightly higher than that of the semiconductor laser chip 21. This is because the higher thermal expansion coefficient of the submount 23 than that of the semiconductor laser chip 21 makes the submount 23 contract to the greater extent as compared with the case where the thermal expansion coefficient of the submount 23 is lower than that of the semiconductor laser chip 21, thereby preventing the semiconductor laser chip 21 from being warped in downward convex shape.

As described above, the semiconductor laser chip 21 is warped in upward convex shape. Therefore, the gap between the bottom surface 21a of the semiconductor laser chip 21 and the top surface 23a of the submount 23 is configured such that the middle portion thereof is larger than the end portions thereof in the optical axis direction. The molten solder moves from the end portions to the middle portion to fill the gap. During this time, since the melting point of Au is higher than that of Sn, the amount of Sn moving from the end portions to the middle portion in the optical axis direction becomes larger than that of Au. As a result, the ratio of Sn to Au becomes higher in the middle portion 24b than in the end portions 24a and 24c in the optical axis direction. The inventors of the present invention have examined the ratio of Sn to Au in the solder layer 24 by an X-ray microanalysis method (hereinafter referred to as an XMA method) to confirm that the Sn ratio was higher in the middle portion 24b than in the end portions 24a and 24c in the optical axis direction.

Since the middle portion 24b is Sn-richer than the end portions 24a and 24c, the melting point of the middle portion 24b of the solder is lower than that of the end portions 24a and 24c of the solder. Therefore, the end portions 24a and 24c of the solder are solidified first and then the middle portion 24b is solidified. Thus, the semiconductor laser chip 21 is warped in upward convex shape.

SECOND EMBODIMENT

Figure 5A:
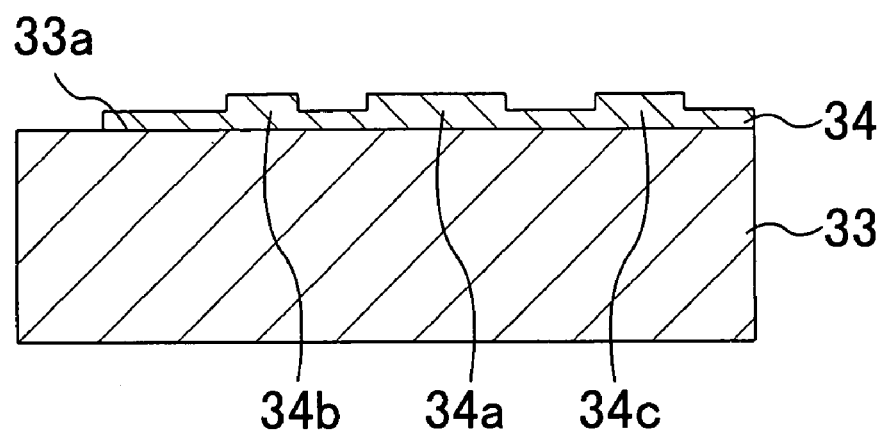
FIG. 5A is a schematic view illustrating a submount of an optical semiconductor device according to a second embodiment of the present invention with a solder applied non-uniformly onto the top surface thereof.
Figure 5B:
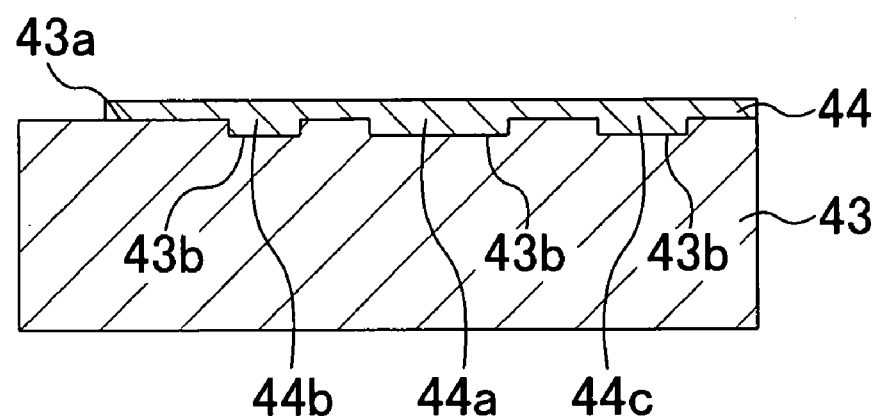
FIG. 5B is a schematic view illustrating the submount of the optical semiconductor device according to the second embodiment of the present invention with a solder applied onto the top surface thereof having recesses formed therein.

FIGS. 5A and 5B are schematic views illustrating the solder placed on a top surface 33a of a submount 33. FIG. 5A shows an example of the present embodiment and FIG. 5B shows another example of the present embodiment.

According to the second embodiment of the present invention, the Sn content in the middle portion of the solder in the optical axis direction is made higher than that in the first embodiment. Detailed explanation is provided below.

Referring to FIG. 5A, the top surface 33a of the submount 33 is flat and the solder is non-uniformly placed thereon. To be more specific, a larger amount of the solder is placed on parts of the top surface 33a of the submount 33, i.e., a middle portion 34a in the optical axis direction and peripheral portions 34b and 34c sandwiching the middle portion 34a, than on the other part of the top surface 33a. This makes it possible to increase the Sn content in the middle portion 34a.

Referring to FIG. 5B, recesses 43b are formed on a top surface 43a of a submount 43. Specifically, the recesses 43b are formed in parts of the top surface 43a of the submount 43, i.e., a middle portion in the optical axis direction and peripheral portions sandwiching the middle portion. When the solder is placed on the thus configured top surface 43a, a larger amount of the solder is placed on the recesses 43b than on the other part of the top surface 43a. This makes it possible to increase the Sn content in the middle portion 44a than in the end portions 44b and 44c in the optical axis direction.

With the structures shown in FIGS. 5A and 5B, the semiconductor laser chips are warped in upward convex shape. Accordingly, residual stress is applied to the semiconductor laser chip in a certain direction within a certain range. Thus, optical semiconductor devices which are lot-produced in this manner show uniform initial characteristic values and uniform changes in operating current value at an early stage of burn-in.

Figure 6A:
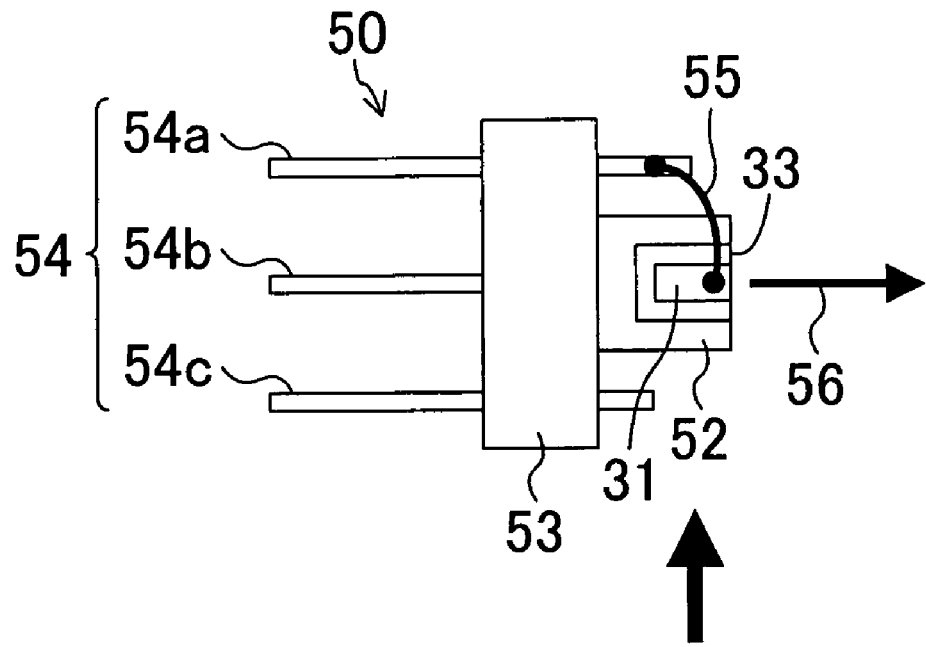
FIG. 6A is a schematic view of the optical semiconductor device of the second embodiment assembled with a metallic package, illustrating the major internal structure of the optical semiconductor device.
Figure 6B:
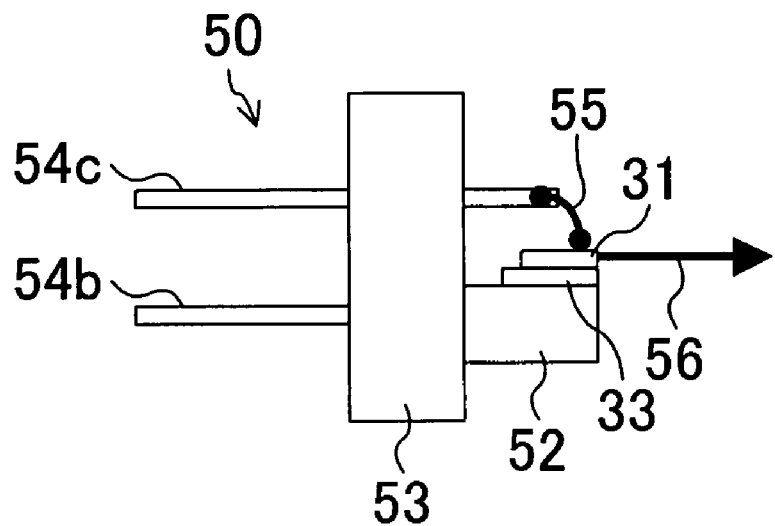
FIG. 6B is a view illustrating the major internal structure observed from the direction of an arrow shown in FIG. 6A.

FIGS. 6A and 6B show the structure of an optical semiconductor device 50 manufactured by soldering a semiconductor laser chip 31 on the submount 33 shown in FIG. 5A and then adhering the submount 33 to a metallic package. FIG. 6A is a schematic view illustrating the internal structure of the optical semiconductor device 50 with a cap (not shown) of the optical semiconductor device 50 detached and FIG. 6B is a schematic view illustrating the internal structure of the optical semiconductor device 50 as observed from the direction of an arrow depicted in FIG. 6A. The semiconductor laser chip 31 is actually warped in upward convex shape, though it is depicted without the warpage in FIG. 6B.

The semiconductor laser chip 31 in upward convex shape is mounted on the submount 33. The submount 33 is soldered onto a metallic block 52 with solder whose melting point is lower than that of the solder layer 24. The metallic block 52 is integrated with a metallic package 53, which is integrated with electrode terminals 54a, 54b and 54c. The electrode terminal 54b is electrically connected to the metallic package 53 and serves as a grand terminal of the optical semiconductor device 50. The electrode terminal 54a serves to inject electric current into the optical semiconductor device 50 and positive voltage with respect to the electrode terminal 54b is applied thereto. The electrode terminal 54a is connected to the semiconductor laser chip 31 through a conductive wire 55.

As to the optical semiconductor device 50 shown in FIGS. 6A and 6B, the inventors of the present invention have examined the uniformity in initial characteristics and the variation in operating current value at an early stage of burn-in. To be more specific, the electrode terminals 54a and 54b were connected to a power source and electric current was injected to the semiconductor laser chip 31. As a result, the optical semiconductor device 50 output a laser beam 56 having a wavelength of 650 nm and a pulse optical output of 250 mW. As the residual stress is applied to the semiconductor laser chip 31 in a certain direction within a certain range, the semiconductor lasers of the same lot showed uniform initial characteristic values and uniform changes in operating current value at an early stage of the burn-in.

THIRD EMBODIMENT

Figure 7A:
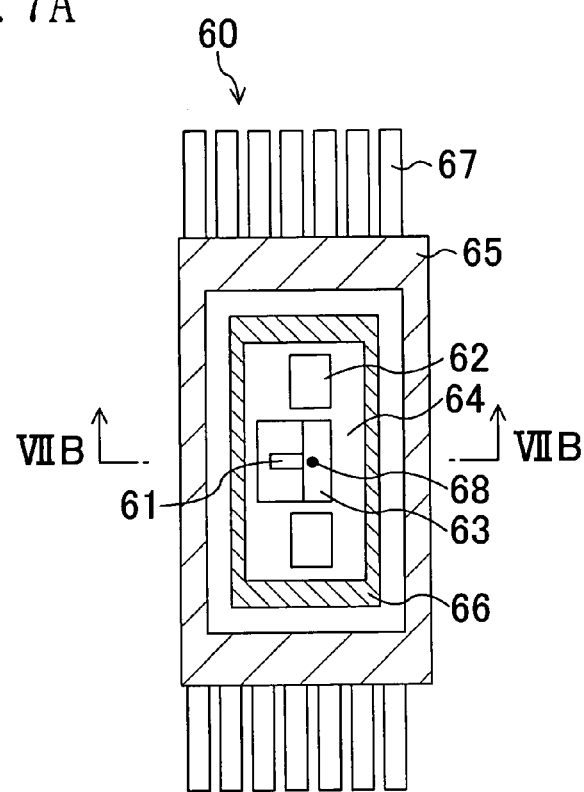
FIG. 7A is a schematic view illustrating the major internal structure of an optical semiconductor device according to a third embodiment of the present invention.
Figure 7B:
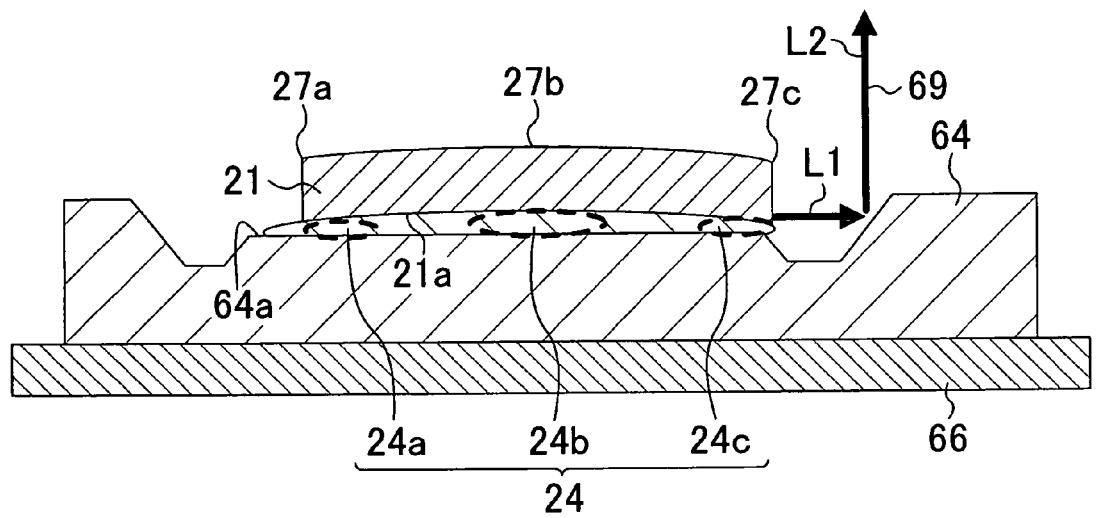
FIG. 7B is a schematic sectional view taken along the line VIIB-VIIB shown in FIG. 7A.

FIGS. 7A and 7B are schematic views illustrating the structure of an optical semiconductor device 60 according to a third embodiment of the present invention. FIG. 7A is a view illustrating the optical semiconductor device 60 with a cap (not shown) on the package detached and FIG. 7B is a sectional view taken along the line VIIB-VIIB shown in FIG. 7A.

The optical semiconductor device 60 shown in FIG. 7A is an integrated optical device including a semiconductor laser chip 21, a light receiving element 62, a circuit for processing received light signals (not shown), a reflective mirror 63, a diffraction grating (not shown), a light receiving element chip 64, a package 65, a Si substrate 66 and electrode terminals 67. The light receiving element chip 64 is provided on the Si substrate 66 and the light receiving element 62 and the signal processing circuit are adhered onto the light receiving element chip 64 with solder. The light receiving element chip 64 is adhered to the package 65 with conductive paste.

The optical semiconductor device 60 is operated as follows. Upon application of electric current to the electrode terminals 67 of the package 65, the semiconductor laser chip 21 is activated to emit a laser beam 69. The laser beam 69 is emitted in the direction parallel to the surface of the light receiving element chip 64 (as indicated by L1 in FIG. 7B), reflected at a reflection point 68 on the reflective mirror 63 and then emitted upward in the vertical direction (as indicated by L2 in FIG. 7B) out of the optical semiconductor device 60. The laser beam 69 emitted out of the optical semiconductor device 60 reads out a signal on an optical disc and returns to the optical semiconductor device 60. The returned laser beam 69 is divided by the diffraction grating (not shown) adhered on the top of the package 65 and received by the light receiving element 61. The light receiving element 61 performs amplification and operation on the received optical signal and inputs the amplified and operated optical signal into the optical signal processing circuit.

When electric current was applied to the electrode terminals 67 by the inventors of the present invention, the optical semiconductor device 60 emitted a laser beam 69 having a wavelength of 650 nm and a pulse optical output of 300 mW. As the residual stress is applied to the semiconductor laser chip 21 in a certain direction within a certain range, the semiconductor lasers of the same lot show uniform initial characteristic values and uniform changes in operating current value at an early stage of the burn-in.

Though not explained in detail, the semiconductor laser chip 21 of the optical semiconductor device 60 is warped in upward convex shape as shown in FIG. 7B. Further, the solder layer 24 is thicker and Sn-richer in the middle portion 24b than in the end portions 24a and 24c in the optical axis direction.

FOURTH EMBODIMENT

Figure 8A:
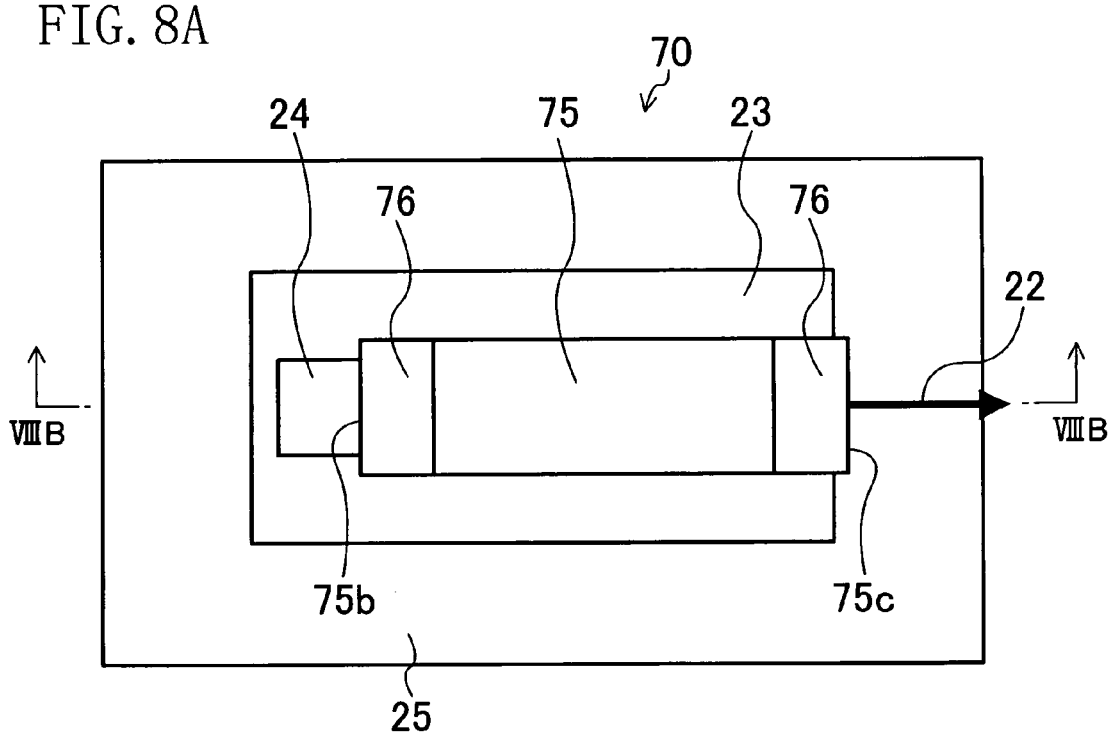
FIG. 8A is a top view illustrating the structure of an optical semiconductor device according to a fourth embodiment of the present invention.
Figure 8B:
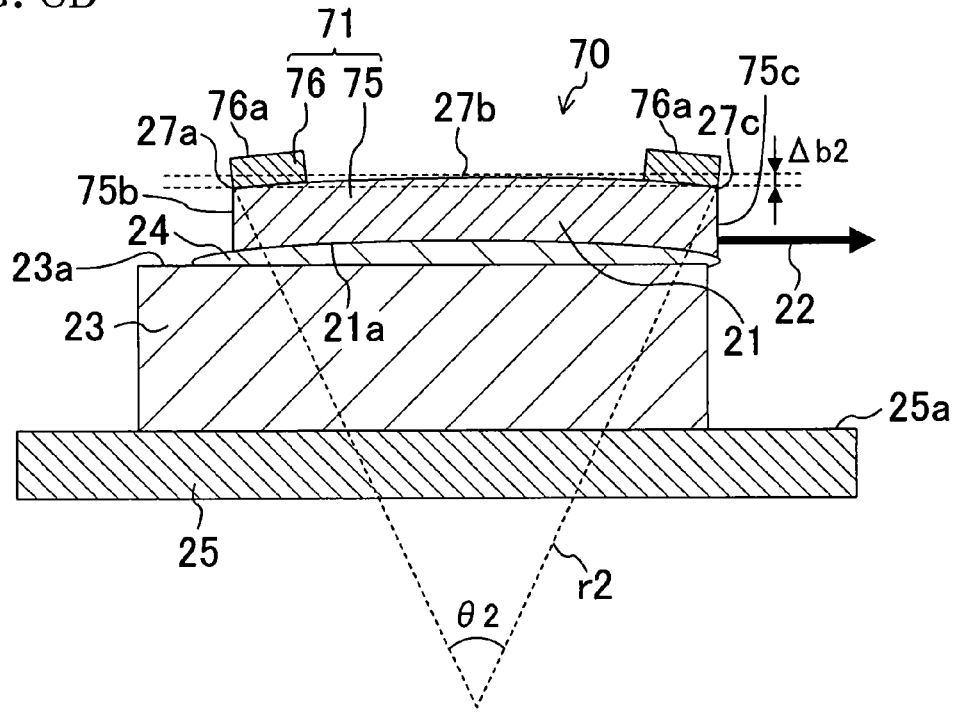
FIG. 8B is a sectional view taken along the line VIIIB-VIIIB shown in FIG. 8A.

FIGS. 8A and 8B illustrate the structure of an optical semiconductor device 70 according to a fourth embodiment of the present invention. FIG. 8A is a top view and FIG. 8B is a sectional view taken along the line VIIIB-VIIIB shown in FIG. 8A.

In the optical semiconductor device 70 of the present embodiment, a semiconductor laser chip 71 includes an element body 75 and projections 76. The element body 75 is warped in upward convex shape to draw an arc with a radius of curvature r2 and a central angle θ2, i.e., it is the semiconductor laser chip 21 of the first embodiment. The end faces 75b and 75c of the semiconductor laser chip 71 function as reflective mirrors of a resonator.

The projections 76 are provided on the periphery of the top surface of the element body 75 to extend along the short sides of the top surface of the element body 75 as shown in FIG. 8A. In the present embodiment, a laser beam 22 is emitted in the direction of the long sides of the top surface of the element body 75. That is, the projections 76 extend in the direction substantially vertical to the optical axis direction. Each of the projections 76 is provided such that the top surface 76a thereof is located above the highest part of the semiconductor laser chip 21.

The projections 76 are preferably Au-plated and made of material having a thermal conductivity not lower than that of the element body. Referring to FIGS. 8A and 8B, each of the projections 76 preferably has a horizontal length of 100 μm, a width of 300 μm and a thickness of 5 μm.

In the same manner as the first embodiment, three kinds of laser devices are lot-produced while the mean value of warpage Δb2 was varied to be −0.12 μm, 0.3 μm and 0.5 μm and their initial operating current values were measured. The results were the same as those obtained in the first embodiment.

The optical semiconductor device 70 shown in FIGS. 8A and 8B was installed in a metallic package to fabricate the devices as shown in FIGS. 7A and 7B and the initial characteristics and the changes in operating current value were measured. As a result, they showed uniform initial characteristic values and uniform changes in operating current value.

Subsequently, explanation of a method for manufacturing the optical semiconductor device 70 of the present embodiment is provided.

First, solder is placed on the top surface 23a of the submount 23.

Then, a flat collet is brought into contact with the projections 76 of the semiconductor laser chip 71 to hold the semiconductor laser chip 71.

With the flat collet contacting the projections 76 of the semiconductor laser chip 71, the flat collect is heated. Simultaneously, the submount 23 is heated from below to heat the semiconductor laser chip 71 entirely. As the solder is molten by the heat, the semiconductor laser chip 71 is pressed onto the molten solder.

Then, the heating of the flat collet and the heating of the submount 23 from below are ceased to solidify the solder.

During this time, the heat of the semiconductor laser chip 71 is dissipated through a first path from the semiconductor laser chip 71 to the submount 23 through the solder layer 24 and a second path from the semiconductor laser chip 71 to the flat collet through the projections 76. The end portions of the semiconductor laser chip 71 in the optical axis direction are partially in contact with air, though the middle portion is not. Therefore, the end portions are cooled faster than the middle portion. As the solder contracts simultaneously with the solidification, the end portions of the semiconductor laser chip 71 in the optical axis direction are pulled toward the submount 23. This is considered as a cause of the warpage of the semiconductor laser chip 71 in upward convex shape.

As described above, the phenomenon that the solder is solidified from the end portions 24a and 24c toward the middle portion 24b in the optical axis direction occurs significantly when the solder made of Au and Sn is used. The inventors of the present invention have analyzed the solder layer 24 with the XMA method to confirm that the Sn ratio was higher in the middle portion 24b than in the end portions 24a and 24c in the optical axis direction.

FIFTH EMBODIMENT

Figure 9A:
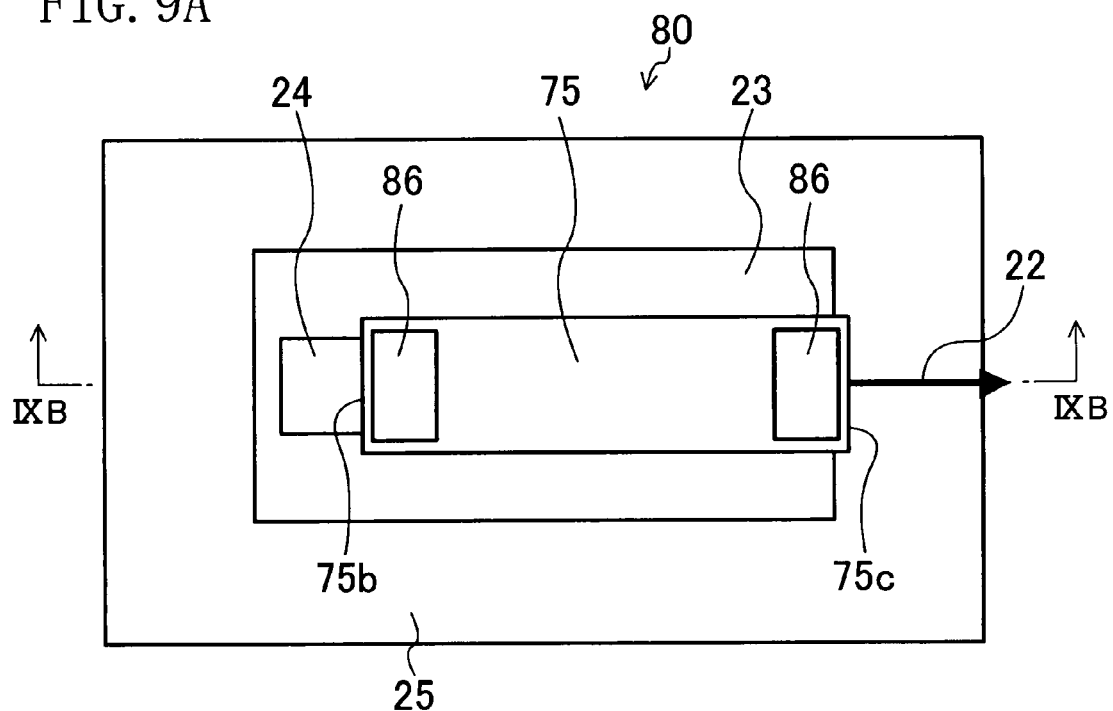
FIG. 9A is a top view illustrating the structure of an optical semiconductor device according to a fifth embodiment of the present invention.
Figure 9B:
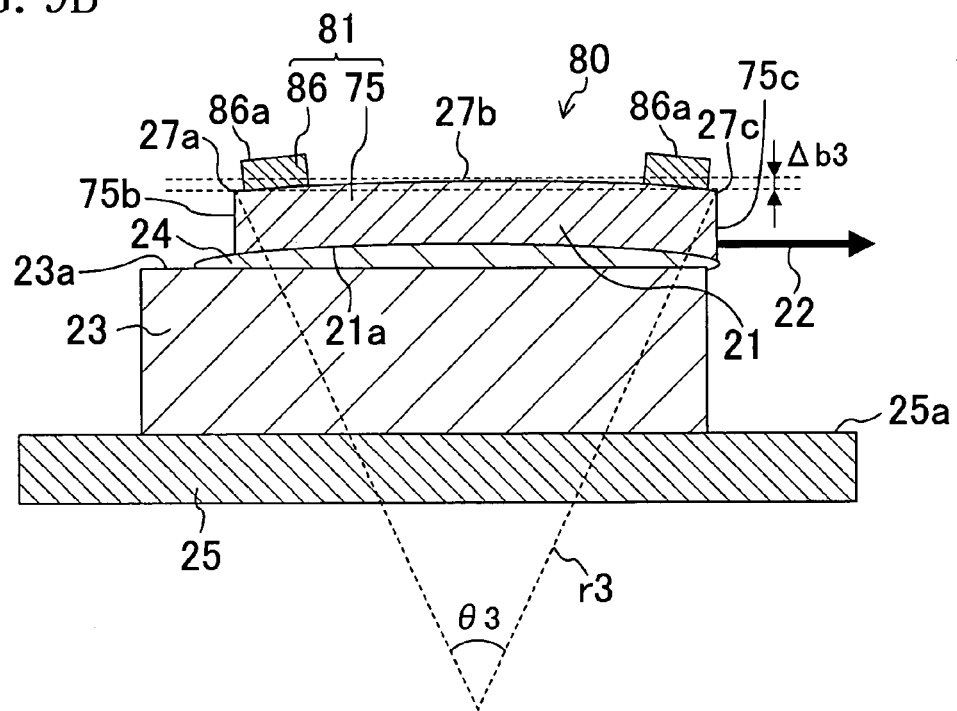
FIG. 9B is a sectional view taken along the line IXB-IXB shown in FIG. 9A.
Figure 10:
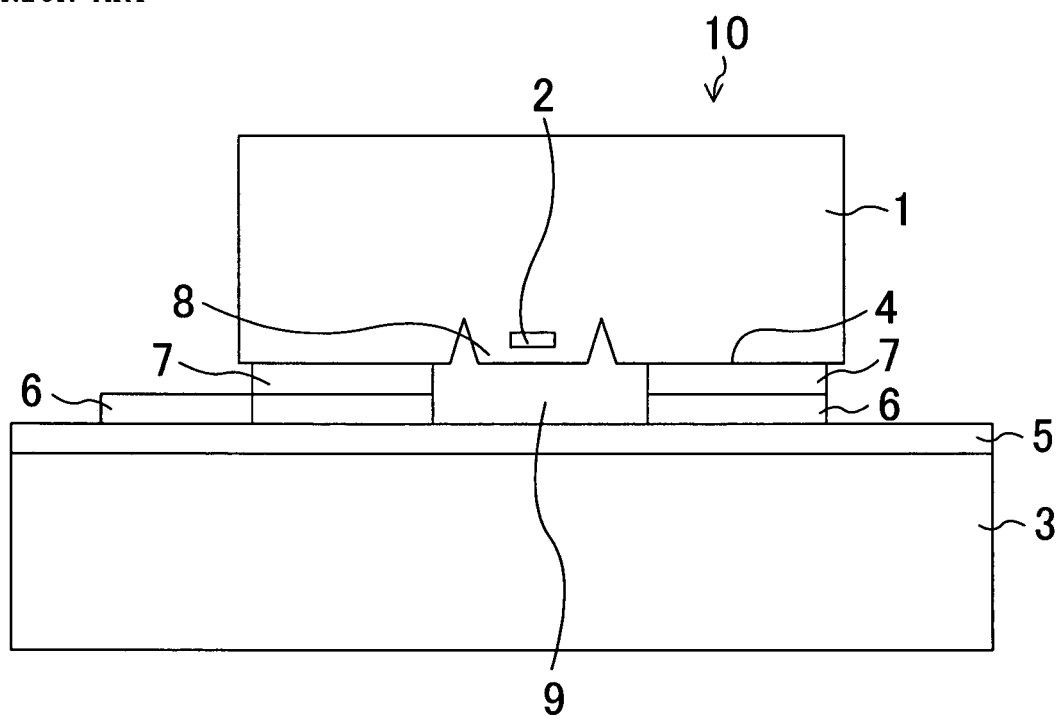
FIG. 10 is a schematic view of a conventional optical semiconductor device.

FIGS. 9A and 9B are schematic views illustrating the structure of an optical semiconductor device 80 according to a fifth embodiment of the present invention. FIG. 9A is a schematic top view of the optical semiconductor device 80 and FIG. 9B is a sectional view taken along the line IXB-IXB of FIG. 9A.

In the same manner as the first embodiment, a semiconductor laser chip 81 is warped in upward convex shape as shown in FIG. 9B. Specifically, it is warped in upward convex shape to draw an arc with a radius of curvature r3 and a central angle θ3.

Further, as shown in FIGS. 9A and 9B, the semiconductor laser chip 81 includes an element body 75 and projections 86. The projections 86 on the top surface of the semiconductor laser chip 81 are located closer to the middle portion as compared with the projections 76 of the fourth embodiment. With this configuration, the optical semiconductor devices 80 fabricated on a mother board are more easily separated by dicing as compared with the structure of the fourth embodiment.

Although the details are omitted, the inventors of the present invention have confirmed the performance of the optical semiconductor device 80 of the present embodiment in the following manner.

Specifically, the optical semiconductor device 80 which outputs a red laser beam was actually fabricated with the semiconductor laser chip 81 made of AlGaInP having a wavelength of 650 nm in order to examine the initial characteristics and the relationship between reliability of the optical semiconductor device 80 and warpage Δb3. The results were substantially the same as those obtained in the first embodiment.

Further, the optical semiconductor device 80 shown in FIGS. 9A and 9B was installed in a metallic package to fabricate the devices as shown in FIGS. 7A and 7B to examine the initial characteristics and the changes in operating current value at an early stage of the burn-in. As a result, they showed uniform initial characteristic values and uniform changes in operating current value.

OTHER EMBODIMENTS

The following modifications may be added to the first to fifth embodiments described above.

In the above description, the AlGaAs semiconductor laser device having a wavelength of 780 nm or the AlGaInP semiconductor laser device having a wavelength of 650 nm are taken as examples of the optical semiconductor device for explanation of the present invention. However, the optical semiconductor device may be a blue laser device or an ultraviolet laser device as long as it is a high power semiconductor laser device usable for rewritable optical discs. Further, the optical semiconductor device may be the one emitting a multiwavelength laser beam such as a two wavelength laser beam or a three wavelength laser beam.

The semiconductor laser chip may be a monolithic component or a hybrid component including a plurality of chips. The semiconductor laser chip is an example of the light emitting element and may be replaced with an edge emitting LED chip.

The projections made of Au in the above description may be made of metal or a semiconductor material having substantially the same thermal conductivity as that of the light emitting element. Alternatively, the projections may be made from the material used for the light emitting element. If a laser chip made of an AlGaInP semiconductor having a wavelength of 650 nm is used as the semiconductor laser chip, a GaAs submount is used. Therefore, the projections may be formed by etching the GaAs submount.

What is claimed is:

1. An optical semiconductor device comprising:
   a light emitting element;
   a base for mounting the light emitting element on a top surface thereof; and
   a connection layer sandwiched between the top surface of the base and a bottom surface of the light emitting element, wherein
   the light emitting element is warped so as to have a radius of curvature of not less than 250 mm and not more than 22,500 mm and to be in upward convex shape.

2. The optical semiconductor device of claim 1, wherein the connection layer contains Au and Sn.

3. The optical semiconductor device of claim 2, wherein the light emitting element emits light such that the light propagates substantially parallel to the top surface of the base,
   the ratio of Sn to Au in the connection layer is higher in a middle portion thereof than in end portions thereof in an optical axis direction, and
   the middle portion contains more Sn than Au.

4. The optical semiconductor device of claim 2, wherein the Sn content in the connection layer is larger than the Au content in the connection layer on a weight percent basis.

5. The optical semiconductor device of claim 2, wherein the light emitting element emits light such that the light propagates substantially parallel to the top surface of the base,
   the thickness of the connection layer is larger at a middle portion thereof than at end portions thereof in an optical axis direction, and
   the middle portion contains more Sn than Au.

6. The optical semiconductor device of claim 2, wherein a recess is formed in a middle portion of the top surface of the base,
   the connection layer is formed on part of the top surface of the base where the recess is not formed and in the recess, and
   the ratio of Sn to Au is higher in part of the connection layer in the recess than in part of the connection layer on the top surface of the base where the recess is not formed.

7. An optical semiconductor device comprising:
   a light emitting element;
   a base for mounting the light emitting element on a top surface thereof; and
   a connection layer sandwiched between the top surface of the base and a bottom surface of the light emitting element, wherein
   the light emitting element is warped in upward convex shape, the light emitting element includes a plate-like element body which is warped in upward convex shape and projections formed on the periphery of a top surface of the element body, and at least part of the top surface of each of the projections is located higher than the top surface of the highest part of the element body.

8. The optical semiconductor device of claim 7, wherein the element body is rectangular when viewed from above, and the projections extend substantially vertical to an optical axis direction of light emitted by the element body.

9. The optical semiconductor device of claim 7, wherein the projections have a thermal conductivity not lower than that of the element body.

10. The optical semiconductor device of claim 1, wherein the base is a Si substrate.

11. The optical semiconductor device of claim 10, wherein at least one of a light receiving element, a circuit and a reflective mirror is mounted on the top surface of the Si substrate.

12. The optical semiconductor device of claim 1, wherein the base is made of metal or a semiconductor which is more capable of dissipating heat than the light emitting element.

13. The optical semiconductor device of claim 1, wherein an active layer for emitting light is formed in part of the light emitting element closer to a bottom surface thereof than to a top surface thereof.

14. The optical semiconductor device of claim 1, wherein the light emitting element is a semiconductor laser chip or an edge emitting LED chip.

15. The optical semiconductor device of claim 7, wherein the light emitting element is a semiconductor laser chip or an edge emitting LED chip.

* * * * *